United States Patent
Wang et al.

(10) Patent No.: US 12,272,740 B2
(45) Date of Patent: Apr. 8, 2025

(54) BIPOLAR JUNCTION TRANSISTORS WITH A NANOSHEET INTRINSIC BASE

(71) Applicant: GlobalFoundries U.S. Inc., Malta, NY (US)

(72) Inventors: Haiting Wang, Clifton Park, NY (US); Hong Yu, Clifton Park, NY (US); Zhenyu Hu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 215 days.

(21) Appl. No.: 17/551,346

(22) Filed: Dec. 15, 2021

(65) Prior Publication Data

US 2023/0071998 A1  Mar. 9, 2023

Related U.S. Application Data

(60) Provisional application No. 63/241,775, filed on Sep. 8, 2021.

(51) Int. Cl.
*H01L 29/737* (2006.01)
*H01L 21/02* (2006.01)
(Continued)

(52) U.S. Cl.
CPC ...... *H01L 29/737* (2013.01); *H01L 21/02532* (2013.01); *H01L 21/0259* (2013.01);
(Continued)

(58) Field of Classification Search
CPC ............. H01L 29/737; H01L 21/02532; H01L 21/0259; H01L 29/0665; H01L 29/165;
(Continued)

(56) References Cited

U.S. PATENT DOCUMENTS 6,087,683 A * 7/2000 King .................. H01L 29/7378
                                                           438/312
7,897,995 B2   3/2011 Yang et al.
(Continued)

OTHER PUBLICATIONS

Wang, Haiting et al., "Lateral Bipolar Transistor," filed on Oct. 25, 2021 as a U.S. Appl. No. 17/509,384.
(Continued)

*Primary Examiner* — Jami Valentine Miller
*Assistant Examiner* — Pratiksha Jayant Lohakare
(74) *Attorney, Agent, or Firm* — Thompson Hine LLP; Francois Pagette

(57) ABSTRACT

Structures for a bipolar junction transistor and methods of fabricating a structure for a bipolar junction transistor. The structure includes a collector having a first semiconductor layer, an emitter having a second semiconductor layer, an intrinsic base including nanosheet channel layers positioned with a spaced arrangement in a layer stack, and a base contact laterally positioned between the first and second semiconductor layers. Each nanosheet channel layer extends laterally from the first semiconductor layer to the second semiconductor layer. Sections of the base contact are respectively positioned in spaces between the nanosheet channel layers. The structure further includes first spacers laterally positioned between the sections of the base contact and the first semiconductor layer, and second spacers laterally positioned between the sections of the base contact and the second semiconductor layer.

20 Claims, 8 Drawing Sheets

(51) Int. Cl.
*H01L 29/06* (2006.01)
*H01L 29/165* (2006.01)
*H01L 29/66* (2006.01)

(52) U.S. Cl.
CPC ........ *H01L 29/0665* (2013.01); *H01L 29/165* (2013.01); *H01L 29/66242* (2013.01)

(58) Field of Classification Search
CPC ........... H01L 29/66242; H01L 27/0623; H01L 29/7317; H01L 29/66439; H01L 29/0673; H01L 29/6625; H01L 29/735; B82Y 10/00
USPC ......................................................... 257/197
See application file for complete search history.

(56) References Cited

U.S. PATENT DOCUMENTS

| | | | | |
|---|---|---|---|---|
| 8,288,758 | B2 * | 10/2012 | Ning | H01L 29/0808 257/19 |
| 8,310,027 | B2 * | 11/2012 | Russ | H01L 21/8249 257/E29.174 |
| 8,420,493 | B2 * | 4/2013 | Ning | H01L 29/0808 438/300 |
| 8,906,755 | B1 * | 12/2014 | Hekmatshoartabari | H10K 59/121 438/234 |
| 9,263,583 | B2 * | 2/2016 | Cai | H01L 21/845 |
| 9,502,504 | B2 * | 11/2016 | Cai | H01L 29/1008 |
| 9,666,669 | B1 | 5/2017 | Balakrishnan et al. | |
| 9,786,656 | B1 | 10/2017 | Anderson et al. | |
| 9,887,278 | B2 * | 2/2018 | Cai | H01L 29/6625 |
| 10,269,790 | B2 | 4/2019 | Cheng et al. | |
| 10,825,921 | B2 * | 11/2020 | Balakrishnan | H01L 29/165 |
| 2006/0060941 | A1 | 3/2006 | Sun et al. | |
| 2016/0087068 | A1 * | 3/2016 | Cai | H01L 29/10 257/526 |
| 2018/0261593 | A1 * | 9/2018 | Cheng | H01L 27/0623 |
| 2018/0277666 | A1 * | 9/2018 | Chu | H01L 29/0657 |
| 2020/0075743 | A1 * | 3/2020 | Lee | H01L 29/165 |
| 2022/0320342 | A1 * | 10/2022 | Hsu | H01L 29/66545 |

OTHER PUBLICATIONS

Yu, Hong et al., "Lateral Bipolar Transistor Structure With Base Over Semiconductor Buffer and Related Method," filed on Nov. 17, 2021 as a U.S. Appl. No. 17/455,290.

J. D. Cressler, "SiGe HBT Technology: A New Contender for Si-Based RF and Microwave Circuit Applications," in IEEE Transactions on Microwave Theory and Techniques, vol. 46, No. 5, pp. 572-589, doi: 10.1109/22.668665 (May 1998).

* cited by examiner

BIPOLAR JUNCTION TRANSISTORS WITH A NANOSHEET INTRINSIC BASE

CROSS-REFERENCE TO RELATED APPLICATIONS

This application claims the benefit of U.S. Provisional Application No. 63/241,775, filed Sep. 8, 2021, which is hereby incorporated by reference herein in its entirety.

BACKGROUND

The invention relates generally to semiconductor devices and integrated circuit fabrication and, in particular, to structures for a bipolar junction transistor and methods of forming a structure for a bipolar junction transistor.

A bipolar junction transistor is a multi-terminal electronic device that includes an emitter, a collector, and an intrinsic base arranged between the emitter and collector to define junctions. In a PNP bipolar junction transistor, the emitter and collector are comprised of p-type semiconductor material, and the intrinsic base is comprised of n-type semiconductor material. In an NPN bipolar junction transistor, the emitter and collector are comprised of n-type semiconductor material, and the intrinsic base is comprised of p-type semiconductor material. During operation, the emitter-base junction is forward biased, the collector-base junction is reverse biased, and the collector-emitter current may be controlled with the base-emitter voltage.

A heterojunction bipolar transistor is a variant of a bipolar junction transistor in which the semiconductor materials of the terminals have different energy bandgaps, which creates emitter-base and collector-base heterojunctions. For example, the collector and/or emitter of a heterojunction bipolar transistor may be constituted by silicon, and the intrinsic base of a heterojunction bipolar transistor may be constituted by silicon-germanium, which is characterized by a narrower band gap than silicon.

Improved structures for a bipolar junction transistor and methods of forming a structure for a bipolar junction are needed.

SUMMARY

In an embodiment, a structure for a bipolar junction transistor is provided. The structure includes a collector having a first semiconductor layer, an emitter having a second semiconductor layer, an intrinsic base including a plurality of nanosheet channel layers positioned with a spaced arrangement in a layer stack, and a base contact laterally positioned between the first semiconductor layer and the second semiconductor layer. Each nanosheet channel layer extends laterally from the first semiconductor layer to the second semiconductor layer. The base contact includes a plurality of sections that are respectively positioned in spaces between the nanosheet channel layers. The structure further includes a first plurality of spacers laterally positioned between the sections of the base contact and the first semiconductor layer, and a second plurality of spacers laterally positioned between the sections of the base contact and the second semiconductor layer.

In an embodiment, a method of forming a structure for a bipolar junction transistor is provided. The method includes forming a collector having a first semiconductor layer, forming an emitter having a second semiconductor layer, forming an intrinsic base having a plurality of nanosheet channel layers positioned with a spaced arrangement in a layer stack, and forming a base contact laterally positioned between the first semiconductor layer and the second semiconductor layer. Each nanosheet channel layer extends laterally from the first semiconductor layer to the second semiconductor layer, and the base contact includes a plurality of sections that are respectively positioned in spaces between the nanosheet channel layers. The method further includes forming a first plurality of spacers laterally positioned between the sections of the base contact and the first semiconductor layer, and forming a second plurality of spacers laterally positioned between the sections of the base contact and the second semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
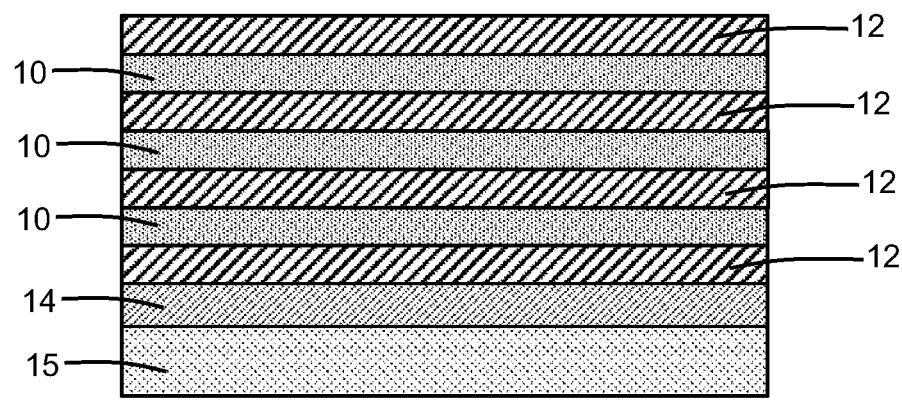
FIG. 1 is a cross-sectional view of a structure for a lateral bipolar transistor at an initial fabrication stage of a fabrication method in accordance with embodiments of the invention.

With reference to FIG. 1 and in accordance with embodiments of the invention, semiconductor layers 10 and semiconductor layers 12 are formed in an alternating sequence as a layer stack on a dielectric layer 15 and a substrate 14. The semiconductor layers 12 may be comprised of a semiconductor material, such as silicon-germanium (SiGe). In an embodiment, the semiconductor layers 12 may be comprised of silicon-germanium with a germanium content of twenty-five percent (25%) to thirty-five percent (35%). The semiconductor layers 10 may be comprised of a semiconductor material, such as silicon, that is chosen to be removable selective to the semiconductor material of the semiconductor layers 12. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. To generate the layer stack, the semiconductor layers 10, 12 may be sequentially formed by an epitaxial growth process with the composition varied during growth to provide the alternating sequence. In an embodiment, the semiconductor layers 12 may contain a p-type dopant (e.g., boron) to provide p-type conductivity. In an alternative embodiment, the semiconductor layers 12 may contain an n-type dopant (e.g., arsenic or phosphorus)

to provide n-type conductivity. The number of pairs of the semiconductor layers 10, 12 in the layer stack may differ from the number of pairs depicted in the representative embodiment.

The semiconductor layers 12 may subsequently provide nanosheet channel layers in a completed device structure for a bipolar junction transistor. In an embodiment, the thickness of each semiconductor layer 12 may range from about 3 nanometers (nm) to about 30 nm. In an embodiment, the thickness of each semiconductor layer 12 may range from about 5 nm to about 20 nm. In an embodiment, the semiconductor layers 12 may have equal thicknesses. In an embodiment, the semiconductor layers 10 may have equal thicknesses.

Figure 2:
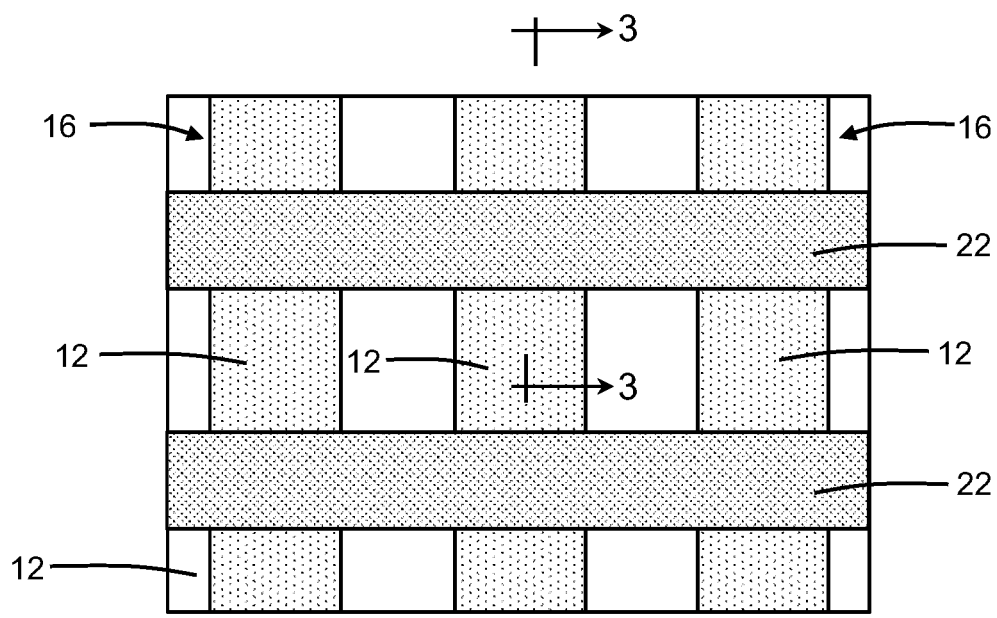
FIG. 2 is a top view of the structure at a fabrication stage subsequent to FIG. 1.
Figure 3:
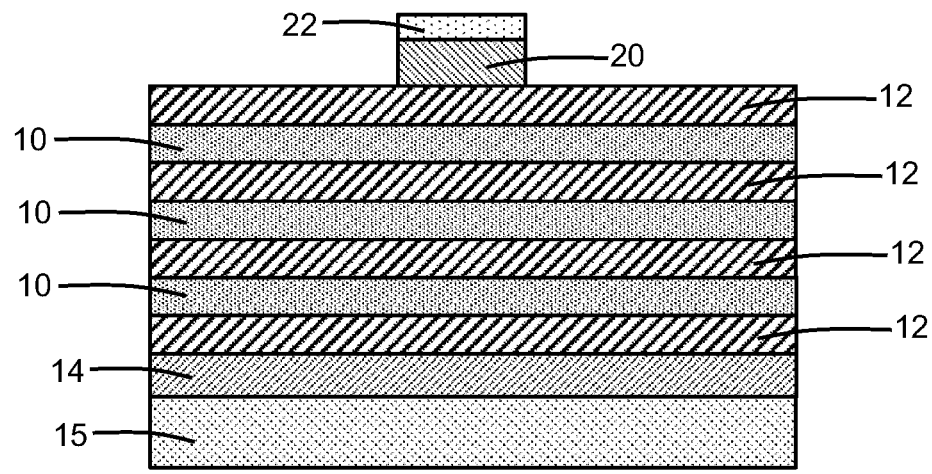
FIG. 3 is a cross-sectional view taken generally along line 3-3 in FIG. 2.

With reference to FIGS. 2, 3 in which like reference numerals refer to like features in FIG. 1 and at a subsequent fabrication stage, fins 16 are formed by patterning the semiconductor layers 10, 12 of the layer stack with lithography and etching processes. Sacrificial structures 20 are formed that extend longitudinally across the fins 16. The sacrificial structures 20 may be comprised of a polycrystalline semiconductor material, such as polycrystalline silicon (i.e., polysilicon), that is deposited by, for example, chemical vapor deposition and patterned, for example, with reactive ion etching. Each sacrificial structure 20 is covered by a dielectric cap 22 that may be associated with the patterning.

Figure 4:
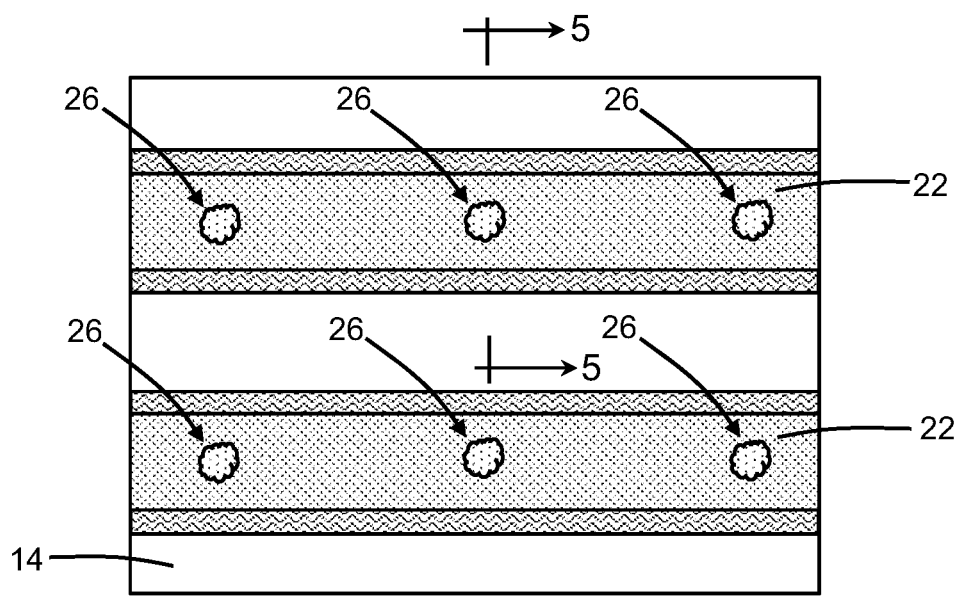
FIG. 4 is a top view of the structure at a fabrication stage subsequent to FIG. 2.
Figure 5:
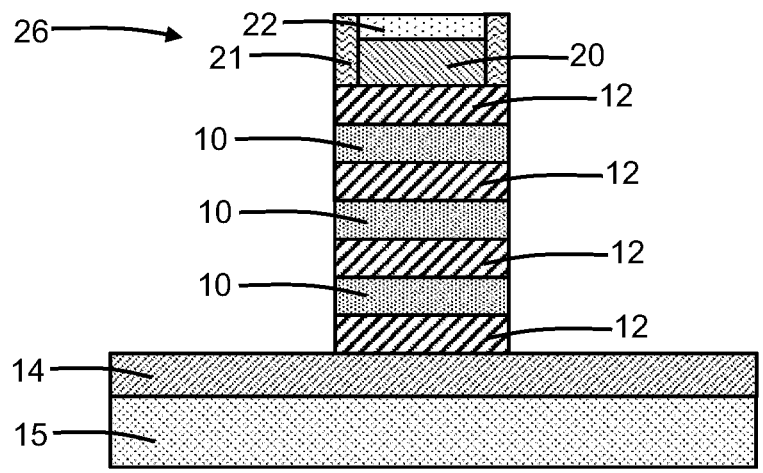
FIG. 5 is a cross-sectional view taken generally along line 5-5 in FIG. 4.

With reference to FIGS. 4, 5 in which like reference numerals refer to like features in FIGS. 2, 3 and at a subsequent fabrication stage, spacers 21 are formed on the sidewalls of each sacrificial structure 20. The fins 16 are then patterned by etching by a self-aligned process using the sacrificial structures 20 and spacers 21 as an etch mask to define bodies 26 where overlapped by the sacrificial structures 20 and spacers 21. Each body 26 includes patterned semiconductor layers 10 and semiconductor layers 12 that alternate in a vertical direction to provide a stacked arrangement.

Figure 6:
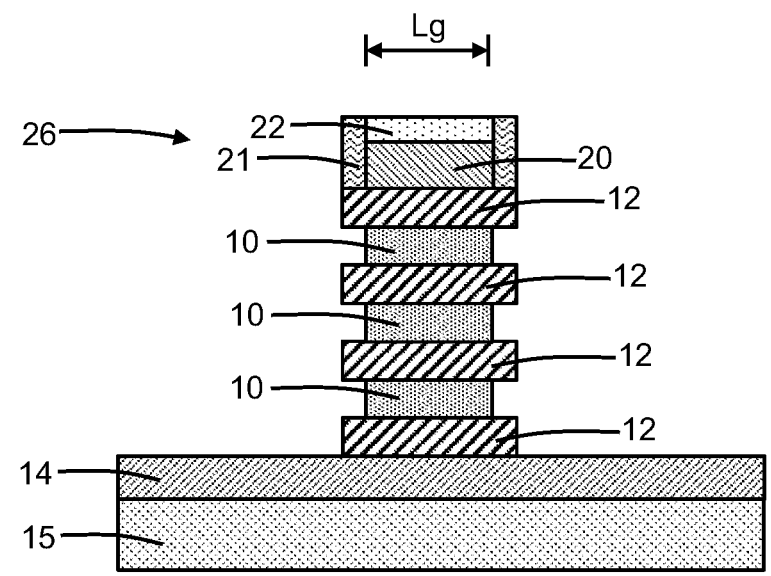
FIGS. 6-13 are cross-sectional views of the structure at successive fabrication stages subsequent to FIGS. 4, 5.

With reference to FIG. 6 in which like reference numerals refer to like features in FIGS. 4, 5 and at a subsequent fabrication stage, the semiconductor layers 10 are laterally recessed relative to the semiconductor layers 12 with a dry or wet isotropic etching process that etches the semiconductor material constituting the semiconductor layers 10 selective to the semiconductor material constituting the semiconductor layers 12. The lateral recessing of the semiconductor layers 10 generates indents in the sidewalls of the bodies 26 because the semiconductor layers 12 are not laterally recessed due to the etch selectivity of the isotropic etching process. The device base width (Wb) may be self-defined by the length Lg of the semiconductor layers 10 after being laterally recessed.

Figure 7:
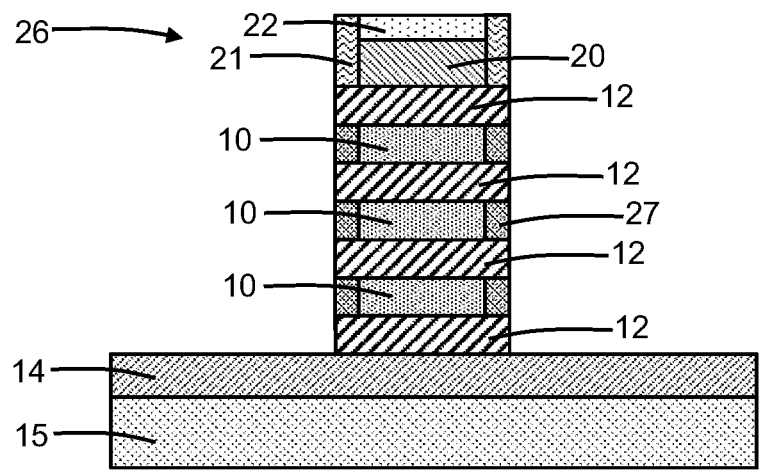

With reference to FIG. 7 in which like reference numerals refer to like features in FIG. 6 and at a subsequent fabrication stage, inner spacers 27 are formed in the indents adjacent to the recessed opposite end portions of the semiconductor layers 10. The inner spacers 27 may be comprised of a dielectric material, such as silicon nitride, that is an electrical insulator. The inner spacers 27 may be formed by depositing a conformal layer of the dielectric material that fills the indents in the sidewalls of the bodies 26 by pinch-off, followed by performing an anisotropic etching process that removes portions of the conformal layer deposited outside of the indents.

Figure 8:
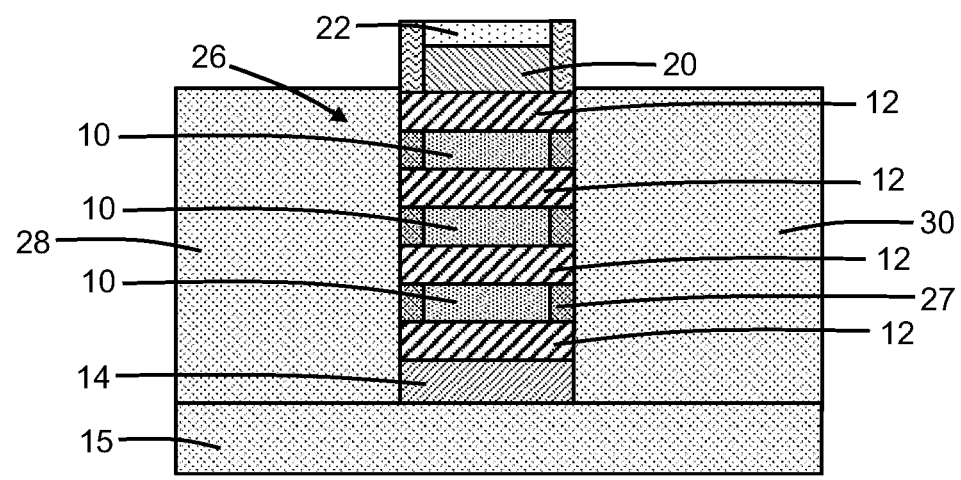

With reference to FIG. 8 in which like reference numerals refer to like features in FIG. 7 and at a subsequent fabrication stage, portions of the dielectric layer 15 are removed by, for example, a pre-clean (e.g., a wet etch using dilute hydrofluoric acid or a dry etch) to expose surfaces of the substrate 14 in the spaces between the bodies 26 and adjacent to the opposite sidewalls of each body 26. Semiconductor layers 28, 30 are formed on the exposed surfaces of the substrate 14. The semiconductor layers 28, 30 may contain a doped semiconductor material, such as silicon doped with an n-type dopant (e.g., phosphorus) to provide n-type conductivity. The semiconductor layers 28, 30 may be formed by an epitaxial growth process in which single-crystal semiconductor material grows (with in situ doping) from the exposed surfaces of the substrate 14.

The semiconductor layers 28, 30 provide terminals (i.e., an emitter and a collector) of a bipolar junction transistor, and the semiconductor layers 12 may collectively provide an intrinsic base of the bipolar junction transistor. The semiconductor layers 12 extend laterally from the semiconductor layer 28 to the semiconductor layer 30. Each semiconductor layer 12 may have an end portion that directly contacts, and is abutted with, the semiconductor layer 28 and an opposite end portion that directly contacts, and is abutted with, the semiconductor layer 30.

Figure 9:
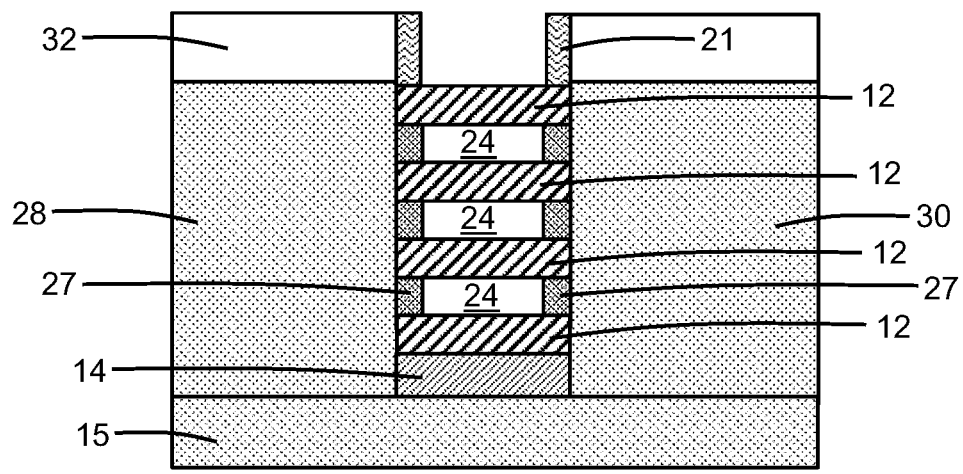

With reference to FIG. 9 in which like reference numerals refer to like features in FIG. 8 and at a subsequent fabrication stage, a dielectric layer 32 is deposited as fill material and planarized. The dielectric layer 32 may be comprised of a dielectric material, such as silicon dioxide, deposited by chemical vapor deposition and planarized by chemical mechanical polishing. The sacrificial structures 20 are removed with one or more etching processes. The removal of the sacrificial structures 20 opens access to the semiconductor layers 10 in each body 26.

The semiconductor layers 10 are then removed from each body 26 by a selective etching process. In an embodiment, the semiconductor layers 10 may be fully removed from each body 26 by a selective etching process. The removal of the semiconductor layers 10 generates spaces 24 that are arranged in a vertical direction between adjacent pairs of semiconductor layers 12 and that extend in a lateral direction across each body 26 between opposite inner spacers 27. The semiconductor layers 12, which have a spaced arrangement in the vertical direction, may collectively provide nanosheet channel layers defining the intrinsic base of a bipolar junction transistor. In an embodiment, the semiconductor layers 12 may have a uniform pitch in the vertical direction. In an embodiment, the semiconductor layers 12 may have a uniform pitch in the vertical direction, as well as a uniform thickness. The dielectric layer 32 masks and protects the semiconductor layers 28, 30 during the removal of the semiconductor layers 10.

Figure 10:
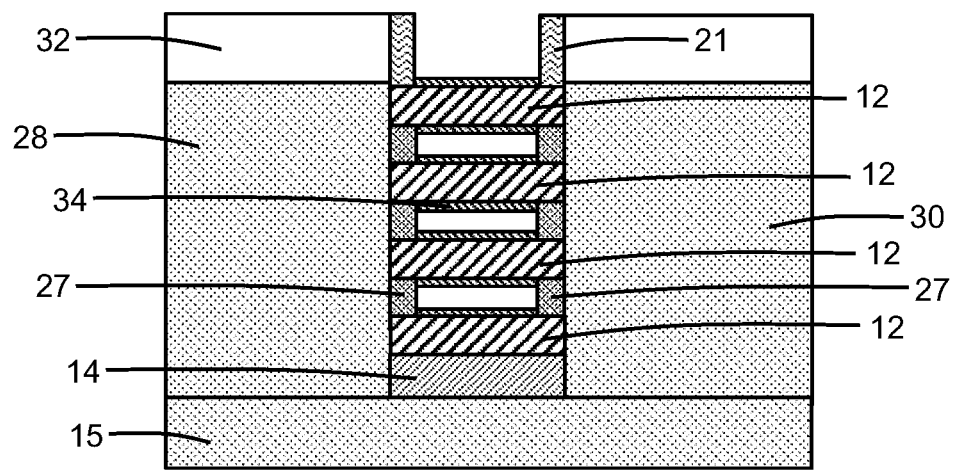

With reference to FIG. 10 in which like reference numerals refer to like features in FIG. 9 and at a subsequent fabrication stage, a semiconductor layer 34 is formed as a coating on the exterior surface of each semiconductor layer 12. In an embodiment, the semiconductor layer 34 may directly contact the exterior surface of each semiconductor layer 12. The semiconductor layers 34 may contain heavily-doped semiconductor material, such as silicon heavily doped with a concentration of a p-type dopant (e.g., boron) to provide p-type conductivity. In an embodiment, the dopant concentration may be greater than $1 \times 10^{19}$ cm$^{-3}$. The semiconductor layers 34 may be formed by an epitaxial growth process in which single-crystal semiconductor material grows (with in situ doping) from growth seeds supplied by the semiconductor layers 12. The semiconductor layers 34 may provide a base extension (i.e., extrinsic base) for contacting the intrinsic based defined by the semiconductor layers 12.

Each semiconductor layer 34 fully wraps about a portion of each semiconductor layer 12. In an embodiment, each semiconductor layer 34 fully wraps about a central portion of each semiconductor layer 12. The inner spacers 27 are laterally positioned between the semiconductor layers 34 and the semiconductor layers 28, 30. The end portion of each semiconductor layer 12 that is abutted with the semiconductor layer 28 and the opposite end portion of each semiconductor layer 12 that is abutted with the semiconductor layer are masked by the inner spacers 27 and are not coated by the semiconductor layer 34. The coated portion (e.g., the coated central portion) of each semiconductor layer 12 is laterally positioned between the opposite end portions that are uncoated.

Figure 11:
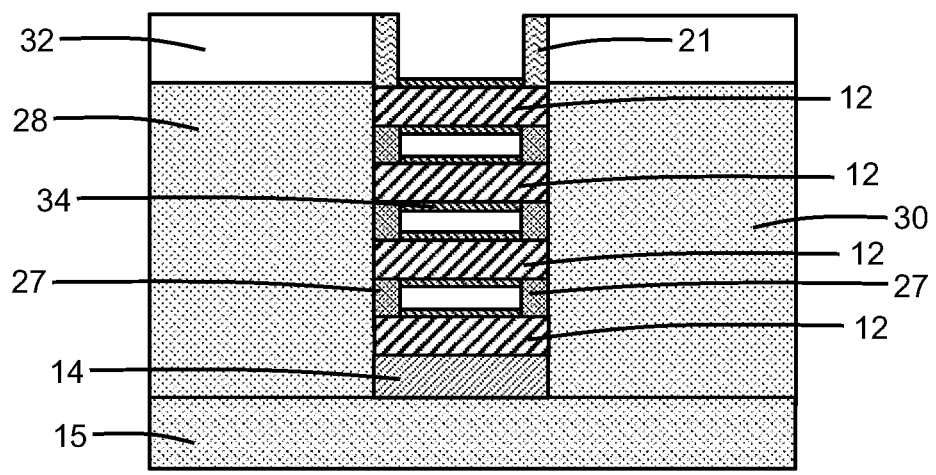
Figure 12:
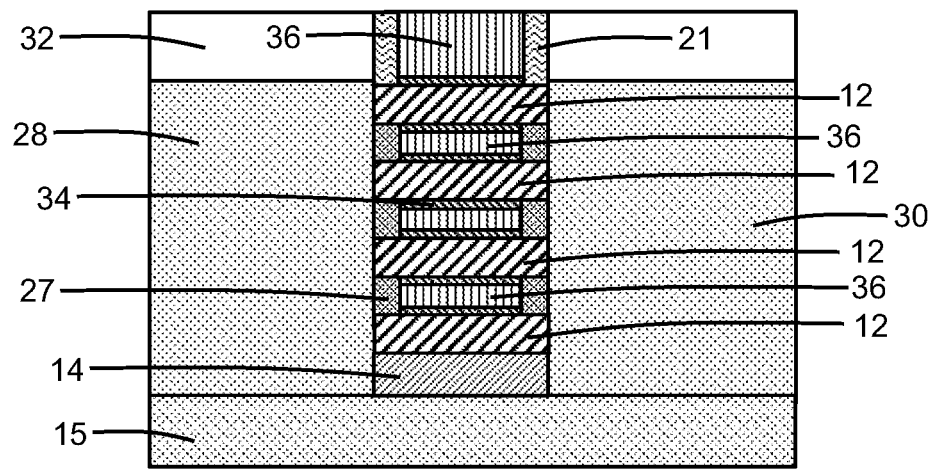

With reference to FIG. 12 in which like reference numerals refer to like features in FIG. 11 and at a subsequent fabrication stage, a base contact 36 comprised of a metal, such as tungsten, is formed that includes sections in the spaces 24 between the semiconductor layers 12 that were formerly occupied by the removed semiconductor layers 10. More specifically, the sections of the base contact 36 may be positioned in the spaces 24 adjacent to the central portions of the semiconductor layers 12. The inner spacers 27 are laterally positioned between the sections of the base contact 36 in the spaces 24 and the semiconductor layers 28, 30, and furnish electrical isolation.

The base contact 36 may be formed by depositing a layer of the metal and planarizing the deposited layer with, for example, chemical-mechanical polishing (CMP). The base contact 36 is coupled by the semiconductor layers 34 to the semiconductor layers 12 as a wrap-around contact. More specifically, the base contact 36 fully wraps around (i.e., surrounds) each of the semiconductor layers 12 with the semiconductor layers 34 separating the sections of the base contact 36 from the semiconductor layers 12.

Figure 13:
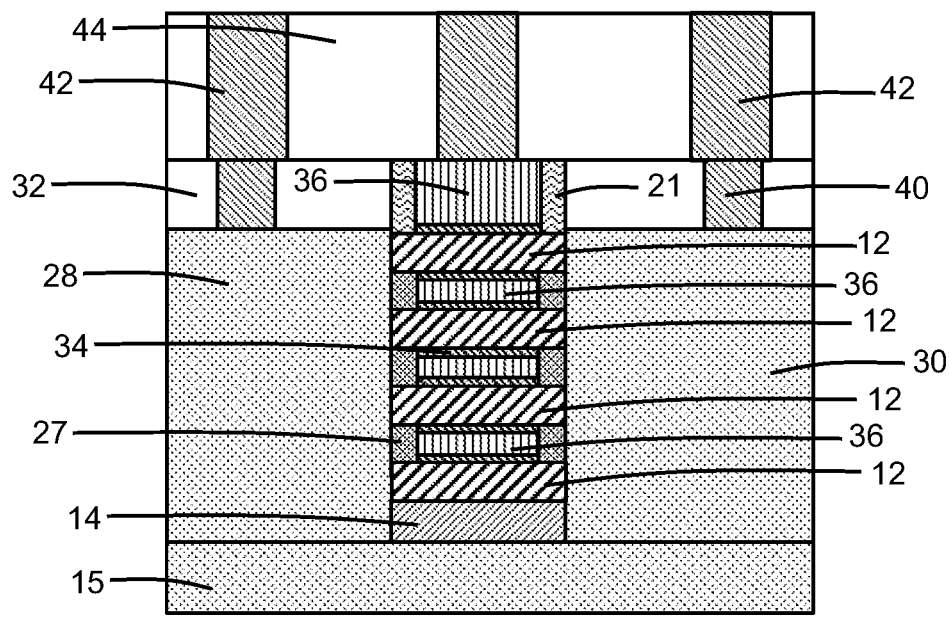

With reference to FIG. 13 in which like reference numerals refer to like features in FIG. 12 and at a subsequent fabrication stage, middle-of-line (MOL) processing follows to form an interconnect structure having contacts 40 and contacts 42 that are coupled to the bipolar junction transistor. The contacts 40, which may be comprised of a trench silicide, are formed in trenches patterned in the dielectric layer 32. The contacts 42 may be comprised of a metal, such as tungsten, and may be formed in a dielectric layer 44.

The resultant structure is a lateral bipolar junction transistor that includes terminals (i.e., an emitter and a collector) defined by the semiconductor layers 28, 30 and an intrinsic base having multiple nanosheet channel layers (i.e., semiconductor layers 12) laterally connecting the emitter and collector. The nanosheet channel layers defined by the semiconductor layers 12 may satisfy large current drivability requirements. In particular, the nanosheet channel layers providing the intrinsic base may permit the current drive to be maximized within a compact footprint. For example, the number of semiconductor layers 12 in the compact footprint can be flexibly varied to satisfy a given current drive requirement. The resultant structure may be suitable for high current drive (high Beta) and high frequency (high Ft and/or high Fmax) applications. The base width (Wb) is self-defined by Lg (FIG. 6), which can be less than or equal to about 20 nm for advanced technologies and may thereby boost Ft and/or Fmax. The intrinsic base (i.e., semiconductor layers 12), the wrap-around extrinsic base (i.e., semiconductor layers 34), and the wrap-around base contact 36 may function to minimize the base resistance (Rb), which may also boost Ft and/or Fmax.

Figure 14:
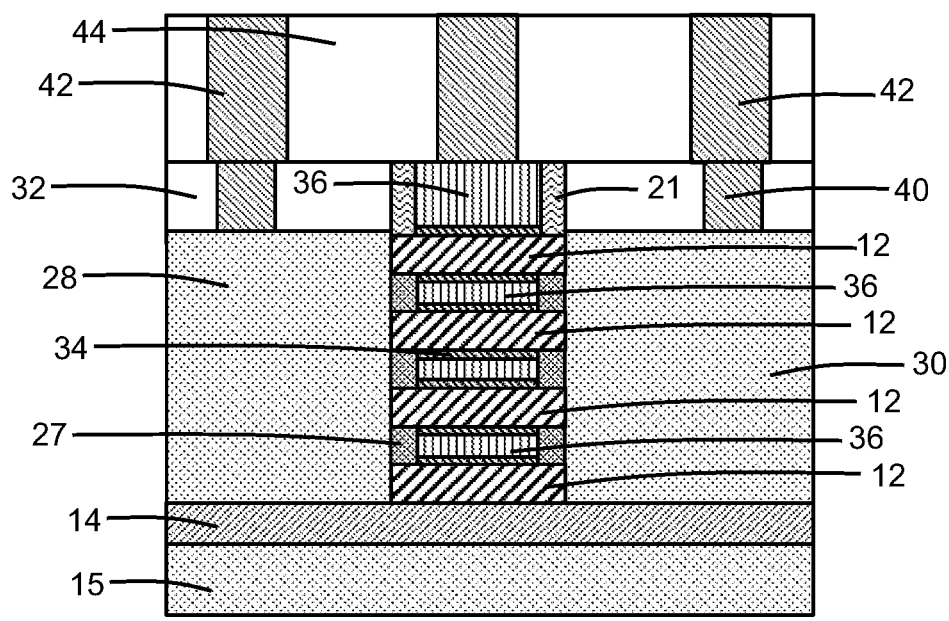
FIG. 14 is a cross-sectional view of a structure in accordance with embodiments of the invention.

With reference to FIG. 14 in which like reference numerals refer to like features in FIG. 13 and in accordance with embodiments, the dielectric layer 15 may be retained in an intact condition before forming the semiconductor layers 28, 30, which may be epitaxially grown from growth seeds provided by the semiconductor layers 12.

Figure 15:
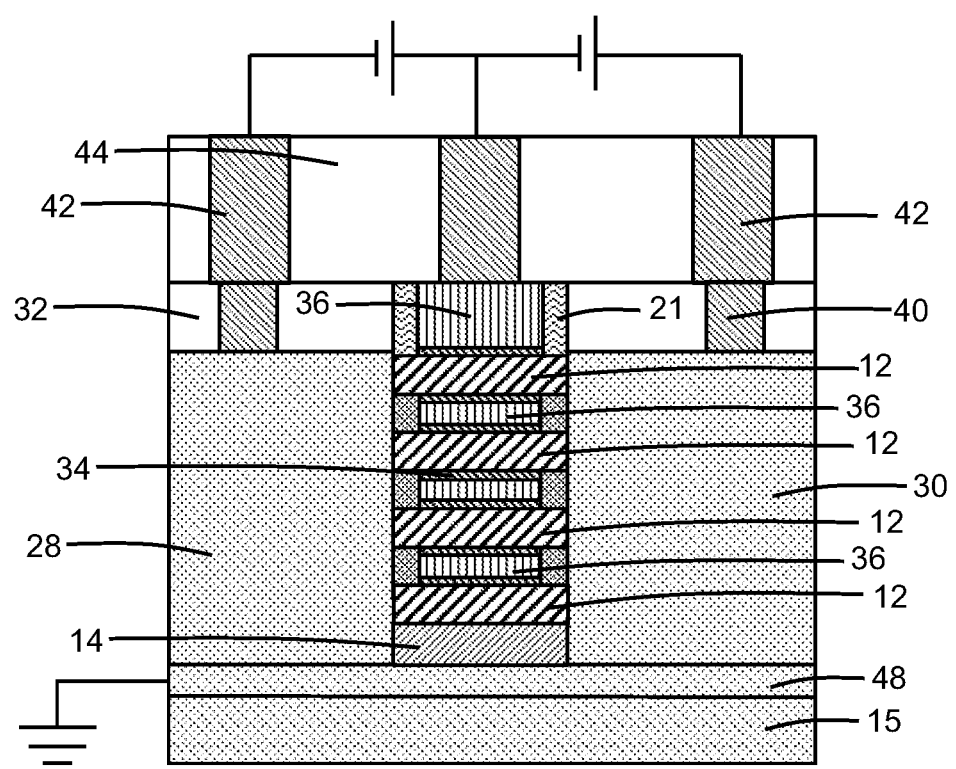
FIG. 15 is a cross-sectional view of a structure in accordance with embodiments of the invention.

With reference to FIG. 15 in which like reference numerals refer to like features in FIG. 13 and in accordance with embodiments, for normal NPN bipolar junction transistor operation, the intrinsic base (i.e., semiconductor layers 12) and emitter (e.g., semiconductor layer 28) may be forward biased relative to each other, and the intrinsic base (i.e., semiconductor layers 12) and collector (e.g., semiconductor layer 30) may be reversed biased relative to each other. Due to the biasing, electrons are collected by the collector due to electron flow through the nanosheet channel layers (i.e., the semiconductor layers 12) of the intrinsic base. The substrate 14 may include a well 48 (e.g., a P-well for an NPN bipolar junction transistor) that may be tapped to ground (or, alternatively, negatively biased) to provide electrical isolation, during operation, that cuts off the substrate channel between the emitter and collector and a portion of the substrate 14 beneath the well 48.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features overlap if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bipolar junction transistor, the structure comprising:
    a collector including a first semiconductor layer;
    an emitter including a second semiconductor layer;
    an intrinsic base including a plurality of nanosheet channel layers positioned with a spaced arrangement in a layer stack, each nanosheet channel layer extending laterally from the first semiconductor layer to the second semiconductor layer;
    a base contact laterally positioned between the first semiconductor layer and the second semiconductor layer, the base contact including a plurality of sections that are respectively positioned in spaces between the nanosheet channel layers, and the base contact comprising a metal;
    a first plurality of spacers laterally positioned between the sections of the base contact and the first semiconductor layer;
    a second plurality of spacers laterally positioned between the sections of the base contact and the second semiconductor layer; and
    a plurality of heavily-doped semiconductor layers respectively positioned between the nanosheet channel layers and the sections of the base contact, each heavily-doped semiconductor layer having a p-type dopant concentration that is greater than $1\times10^{19}$ cm$^{-3}$.

2. The structure of claim 1 wherein each heavily-doped semiconductor layer fully wraps about a central portion of one of the nanosheet channel layers.

3. The structure of claim 2 wherein each nanosheet channel layer includes a first end portion abutted with the first semiconductor layer and a second end portion abutted with the second semiconductor layer, and the central portion is laterally arranged between the first end portion and the second end portion.

4. The structure of claim 2 wherein each heavily-doped semiconductor layer is in direct contact with one of the nanosheet channel layers, and the nanosheet channel layers comprise silicon-germanium, and the heavily-doped semiconductor layers comprise silicon.

5. The structure of claim 2 wherein each heavily-doped semiconductor layer is in direct contact with one of the nanosheet channel layers, the first plurality of spacers are laterally arranged between the heavily-doped semiconductor layers and the first semiconductor layer, and the second plurality of spacers are laterally arranged between the heavily-doped semiconductor layers and the second semiconductor layer.

6. The structure of claim 1 wherein each heavily-doped semiconductor layer is in direct contact with one of the nanosheet channel layers.

7. The structure of claim 1 wherein the nanosheet channel layers comprise silicon-germanium, and the heavily-doped semiconductor layers comprise silicon.

8. The structure of claim 1 wherein the first plurality of spacers are laterally arranged between the heavily-doped semiconductor layers and the first semiconductor layer, and the second plurality of spacers are laterally arranged between the heavily-doped semiconductor layers and the second semiconductor layer.

9. The structure of claim 1 wherein each nanosheet channel layer includes a central portion, a first end portion abutted with the first semiconductor layer, and a second end portion abutted with the second semiconductor layer, the central portion is laterally arranged between the first end portion and the second end portion, and one of the sections of the base contact is positioned in each space adjacent to the central portion of one of the nanosheet channel layers.

10. The structure of claim 1 wherein the metal is tungsten.

11. The structure of claim 10 wherein the nanosheet channel layers comprise silicon-germanium.

12. The structure of claim 1 wherein the first plurality of spacers and the second plurality of spacers comprise a dielectric material that is an electrical insulator.

13. The structure of claim 1 wherein the base contact extends in a vertical direction above the nanosheet channel layers in the layer stack.

14. A method of fabricating a structure for a bipolar junction transistor, the method comprising:
    forming a collector including a first semiconductor layer;
    forming an emitter including a second semiconductor layer;
    forming an intrinsic base including a plurality of nanosheet channel layers positioned with a spaced arrangement in a layer stack, wherein each nanosheet channel layer extends laterally from the first semiconductor layer to the second semiconductor layer;
    forming a base contact laterally positioned between the first semiconductor layer and the second semiconductor layer, wherein the base contact includes a plurality of sections that are respectively positioned in spaces between the nanosheet channel layers, and the base contact comprises a metal;
    forming a first plurality of spacers laterally positioned between the sections of the base contact and the first semiconductor layer;
    forming a second plurality of spacers laterally positioned between the sections of the base contact and the second semiconductor layer; and
    forming a plurality of heavily-doped semiconductor layers respectively positioned between the nanosheet channel layers and the sections of the base contact, wherein each heavily-doped semiconductor layer having a p-type dopant concentration that is greater than $1\times10^{19}$ cm$^{-3}$.

15. The method of claim 14 wherein each heavily-doped semiconductor layer fully wraps about a central portion of one of the nanosheet channel layers, each nanosheet channel layer includes a first end portion abutted with the first semiconductor layer and a second end portion abutted with the second semiconductor layer, and the central portion is laterally arranged between the first end portion and the second end portion.

16. The method of claim 14 wherein the first plurality of spacers are laterally arranged between the heavily-doped semiconductor layers and the first semiconductor layer, and the second plurality of spacers are laterally arranged between the heavily-doped semiconductor layers and the second semiconductor layer.

17. The method of claim 14 wherein each heavily-doped semiconductor layer is in direct contact with one of the nanosheet channel layers, the nanosheet channel layers comprise silicon-germanium, and the heavily-doped semiconductor layers comprise silicon.

18. The method of claim 14 wherein the base contact extends in a vertical direction above the nanosheet channel layers in the layer stack.

19. The method of claim 14 wherein the metal is tungsten.

20. The method of claim 19 wherein the nanosheet channel layers comprise silicon-germanium.

* * * * *